(12) United States Patent
Watanabe et al.

(10) Patent No.: US 8,617,653 B2
(45) Date of Patent: Dec. 31, 2013

(54) OVER-COATING AGENT FOR FORMING FINE PATTERNS AND A METHOD OF FORMING FINE PATTERNS USING SUCH AGENT

(75) Inventors: Tsunehiro Watanabe, Kawasaki (JP); Toshiki Takedutsumi, Kawasaki (JP); Masanori Yagishita, Kawasaki (JP); Kiyofumi Mitome, Kawasaki (JP); Takahito Imai, Kawasaki (JP); Masatoshi Hashimoto, Kawasaki (JP); Masaji Uetsuka, Kawasaki (JP)

(73) Assignee: Tokyo Ohka Okgyo Co., Ltd., Kanagawa (JP)

( * ) Notice: Subject to any disclaimer, the term of this patent is extended or adjusted under 35 U.S.C. 154(b) by 0 days.

(21) Appl. No.: 12/885,782

(22) Filed: Sep. 20, 2010

(65) Prior Publication Data

US 2011/0183071 A1    Jul. 28, 2011

Related U.S. Application Data

(63) Continuation of application No. 12/656,270, filed on Jan. 22, 2010, now abandoned, which is a continuation of application No. 12/453,424, filed on May 11, 2009, now abandoned, which is a continuation of application No. 12/232,175, filed on Sep. 11, 2008, now abandoned, which is a continuation of application No. 11/892,507, filed on Aug. 23, 2007, now abandoned.

(30) Foreign Application Priority Data

Aug. 23, 2006  (JP) .................................. 2006-226073

(51) Int. Cl.
*B05D 3/02* (2006.01)
*C09D 11/10* (2006.01)
*C08L 39/06* (2006.01)

(52) U.S. Cl.
USPC ............ 427/272; 257/E21.026; 257/E21.259; 257/E21.492; 427/259; 427/385.5; 430/299; 430/312; 430/313; 524/251; 524/548

(58) Field of Classification Search
USPC ............. 427/258, 261, 264, 265, 282, 372.2, 427/384, 385.5, 171, 259, 270–272, 393.5, 427/458–460; 524/251, 548; 430/299, 312, 430/313; 257/E21.026, E21.259, E21.492
See application file for complete search history.

(56) References Cited

U.S. PATENT DOCUMENTS

| | | | | | |
|---|---|---|---|---|---|
| 3,669,657 | A | * | 6/1972 | Adams et al. | 430/49.1 |
| 5,157,527 | A | * | 10/1992 | De Keyzer et al. | 349/106 |
| 2001/0014729 | A1 | * | 8/2001 | Hayakawa et al. | 528/272 |
| 2004/0219464 | A1 | * | 11/2004 | Dunham et al. | 430/320 |
| 2004/0267050 | A1 | * | 12/2004 | DeCourcy et al. | 562/600 |
| 2007/0259287 | A1 | * | 11/2007 | Sakakibara et al. | 430/270.1 |

FOREIGN PATENT DOCUMENTS

| | | | |
|---|---|---|---|
| EP | 1489464 A2 | * | 12/2004 |
| JP | 1-307228 | | 12/1989 |
| JP | 4-364021 | | 12/1992 |
| JP | 5-166717 | | 7/1993 |
| JP | 5-241348 | | 9/1993 |
| JP | 7-45510 | | 2/1995 |
| JP | 2003-84459 | | 3/2003 |
| JP | 2003-84460 | | 3/2003 |
| JP | 2003-107752 | | 4/2003 |
| JP | 2003-142381 | | 5/2003 |
| JP | 2003-195527 | | 7/2003 |
| JP | 2003-202679 | | 7/2003 |
| WO | WO 2005116776 A1 | * | 12/2005 |

* cited by examiner

*Primary Examiner* — Alexander Weddle
(74) *Attorney, Agent, or Firm* — Wenderoth, Lind & Ponack, L.L.P.

(57) ABSTRACT

It is disclosed an over-coating agent for forming fine patterns which is applied to cover a substrate having photoresist patterns thereon and allowed to shrink under heat so that the spacing between adjacent photoresist patterns is lessened, with the applied film of the over-coating agent being removed to form fine patterns, further characterized by comprising a water-soluble polymer which contains a monomeric component and a dimeric component, wherein the total content of the monomeric component and the dimeric component in the water-soluble polymer is reduced to 10 mass % or less, and a method of forming fine patterns using the same. By the present invention, even in reducing the pattern size on a substrate having thereon patterns having different pitches, the heat shrinkage of the over-coating agent can be controlled, irrespective whether the pitch is dense or isolate, thus achieving the pattern size reduction.

10 Claims, No Drawings

OVER-COATING AGENT FOR FORMING FINE PATTERNS AND A METHOD OF FORMING FINE PATTERNS USING SUCH AGENT

This application is a Continuation of U.S. application Ser. No. 12/656,270, filed Jan. 22, 2010, now abandoned, which is a Continuation of U.S. application Ser. No. 12/453,424, filed May 11, 2009, now abandoned, which is a Continuation of U.S. application Ser. No. 12/232,175, filed Sep. 11, 2008, now abandoned, which is a Continuation of Ser. No. 11/892,507, filed Aug. 23, 2007, now abandoned.

BACKGROUND OF THE INVENTION

1. Field of the Invention

This invention relates to an over-coating agent for forming fine patterns in the field of photolithographic technology and a method of forming fine-line patterns using such agent. More particularly, the invention relates to an over-coating agent for forming or defining fine-line patterns, such as hole patterns and trench patterns, that can meet today's requirements for higher packing densities and smaller sizes of semiconductor devices.

2. Description of the Related Art

In the manufacture of electronic components such as semiconductor devices and liquid-crystal devices, there is employed the photolithographic technology which, in order to perform a treatment such as etching on the substrate, first forms a film (photoresist layer) over the substrate using a so-called radiation-sensitive photoresist which is sensitive to activating radiations, then performs exposure of the film by selective illumination with an activating radiation, performs development to dissolve away the photoresist layer selectively to form an image pattern (photoresist pattern), and forms a variety of patterns including contact providing patterns such as a hole pattern and a trench pattern using the photoresist pattern as a protective layer (mask pattern).

With the recent increase in the need for higher packing densities and smaller sizes of semiconductor devices, increasing efforts are being made to form sufficiently fine-line patterns and submicron-electronic fabrication capable of forming patterns with linewidths of no more than 0.20 µm is currently required. As for the activating light rays necessary in the formation of mask patterns, short-wavelength radiations such as KrF, ArF and $F_2$ excimer laser beams and electron beams are employed. Further, active R&D efforts are being made to find photoresist materials as mask pattern formers that have physical properties adapted to those short-wavelength radiations.

In addition to those approaches for realizing submicron-electronic fabrication which are based on photoresist materials, active R&D efforts are also being made on the basis of pattern forming method with a view to finding a technology that can provide higher resolutions than those possessed by photoresist materials.

For example, Patent Reference 1 discloses a method of forming fine patterns which comprises the steps of defining patterns (=photoresist-uncovered patterns) in a pattern-forming resist on a substrate, then coating over entirely the substrate with a mixing generating resist that is to be mixed with said pattern-forming resist, baking the assembly to form a mixing layer on both sidewalls and the top of the pattern-forming resist, and removing the non-mixing portions of said mixing generating resist such that the feature size of the photoresist-uncovered pattern is reduced by an amount comparable to the dimension of said mixing layer. Patent Reference 2 discloses a pattern forming method comprising the steps of depositing a resin, which becomes insoluble in the presence of an acid, on a substrate having formed thereon a resist pattern containing an acid generator, heat treating the assembly so that the acid is diffused from the resist pattern into said resin insoluble in the presence of an acid to form a given thickness of insolubilized portion of the resist near the interface between the resin and the resist pattern, and developing the resist to remove the resin portion through which no acid has been diffused, thereby ensuring that the feature size of the pattern is reduced by an amount comparable to the dimension of said given thickness.

However, in these methods, it is difficult to keep the in-plane temperature of the wafers uniformly by means of the heater employed in current fabrication of semiconductor devices, and therefore the heat dependency of the layers formed on the resist patterns on the wafers is as great as ten-odd nanometers per degree Celsius, and this leads to the problem of occurrence of significant variations in pattern dimensions. Furthermore, there are other problems such as occurrences of defects due to the layers formed on the resist patterns and cracks in the layers themselves. In addition, these methods tend to be highly resist-dependent because the degrees of reducing pattern dimensions largely differ due to the contents of acids in the resists.

Another approach known to be capable of reducing pattern dimensions is by fluidizing resist patterns through heat treatment and the like. For example, Patent Reference 3 discloses a method comprising the steps of forming a resist pattern on a substrate and applying heat treatment to deform the cross-sectional shape of the resist pattern, thereby defining a fine pattern. In addition, Patent Reference 4 discloses a method comprising the steps of forming a resist pattern and heating it to fluidize the resist pattern, thereby changing the dimensions of its resist pattern to form or define a fine-line pattern.

In these methods, the wafer's in-plane heat dependency of the resist pattern is only a few nanometers per degree Celsius and is not very problematic. On the other hand, it is difficult to control the resist deformation and fluidizing on account of heat treatment, and resist pattern profile deteriorate, such as non-rectangularization, pattern-collapse, so it is not easy to form a uniform fine-lined resist pattern in a wafer's plane.

An evolved version of those methods is disclosed in Patent Reference 5 and it comprises the steps of forming a resist pattern on a substrate, forming a stopper resin on the substrate to prevent excessive thermal fluidizing of the resist pattern, then applying heat treatment to fluidize the resist so as to change the dimensions of its pattern, and thereafter removing the stopper resin to form or define a fine-line pattern. As the stopper resin, specifically, polyvinyl alcohol is employed. However, polyvinyl alcohol alone is not highly soluble in water and cannot be readily removed completely by washing with water, introducing difficulty in forming a pattern of good profile. The pattern formed is not completely satisfactory in terms of stability over time. In addition, polyvinyl alcohol cannot be applied efficiently by coating, and when it is employed to a substrate formed thereon resist patterns having a different spacing, i.e., a wide spacing and a narrow spacing, between adjacent resist patterns, in-plane-uniform amounts of shrinkage cannot be obtained. Because of these and other problems, the method disclosed in Patent Reference 5 has yet not to be adopted commercially.

For solving these prior-art problems, the present applicant has proposed a technique directed to an over-coating agent for forming fine patterns and to a method of forming fine patterns in Patent References 6-11. The technique shown in these Patent References 6-11 has made it possible to form fine-line patterns that satisfy pattern dimension controllability, good profile and other necessary properties for semiconductor devices. These techniques are quite efficient in defining fine-line patterns on the substrate especially having photoresist patterns thereon in the same pitches, but there have not been made investigations for the substrate having photoresist patterns having thereon in the different spacing or "pitch" between adjacent photoresist patterns, such as "isolate" patterns having wide spacing between adjacent photoresist patterns, and "dense" patterns having narrow spacing between adjacent photoresist patterns.

In forming fine-line patterns or reducing the spacing between adjacent photoresist patterns on the substrate where the photoresist patterns have different pitches of both isolate patterns and dense patterns, the thermal-shrinkage behavior of the over-coating agent tends to be pitch-dependent of the photoresist patterns, and it was difficult to control to obtain the equal amount of thermal shrinkage of the over-coating agent without regard to differences of pitches of photoresist patterns. Therefore, reducing amount of the patterns differ between the photoresist patterns formed by isolate pitches and the ones formed by dense pitches. Because of this, it was conducted to control the temperature of the heat treatment and time of the heat treatment of the over-coating agent (coating film) in accordance with the degree of isolation or density of the pitches so as to obtain pitch-independently the equal amount of thermal shrinkage of the coating. In this technique, however, the amount of the shrinkage is apt to vary due to a lot-to-lot variability of the over-coating agent.

It is desirable that, even when various patterns differing in the pattern dimension and the line-to-line distance exist on one substrate, such as densely-pitched ones or isolated-pitched ones, all the patterns could enjoy the same degree of thermal shrinkage of the over-coating agent.

Patent Reference 1: JP5-166717A
Patent Reference 2: JP5-241348A
Patent Reference 3: JP1-307228A
Patent Reference 4: JP4-364021A
Patent Reference 5: JP7-45510A
Patent Reference 6: JP2003-084459A
Patent Reference 7: JP2003-084460A
Patent Reference 8: JP2003-107752A
Patent Reference 9: JP2003-142381A
Patent Reference 10: JP2003-195527A
Patent Reference 11: JP2003-202679A

SUMMARY OF THE INVENTION

The present invention has been accomplished in order to solve the aforementioned problems of the prior art and has as an object providing a technique utilizing a method of forming fine patterns, which comprises providing the over-coating agent (coating film) on a substrate having thereon a photoresist pattern and causing shrinkage of the resultant coating film to reduce the photoresist pattern spacing and then removing the coating film, even in reducing the pattern size on a substrate having thereon photoresist patterns having at least two different spacings, the reduction of the pattern size in the wafer plane (the reduction of the photoresist pattern spacing) can be controlled, irrespective whether the pattern pitch is dense or isolate.

In order to attain the object, the present invention provides an over-coating agent for forming fine patterns which is applied to cover a substrate having photoresist patterns thereon and allowed to shrink under heat so that the spacing between adjacent photoresist patterns is lessened, with the applied film of the over-coating agent being removed to form fine patterns, further characterized by comprising a water-soluble polymer which contains a monomeric component and a dimeric component, wherein the total content of the monomeric component and the dimeric component in the water-soluble polymer is reduced to 10 mass % or less.

The present invention further provides a method of forming fine patterns comprising the steps of covering a substrate having thereon photoresist patterns with the above-described over-coating agent for forming fine patterns, then applying heat treatment to shrink the applied over-coating agent under the action of heat so that the spacing between the adjacent photoresist patterns is lessened, and subsequently removing the applied film of the over-coating agent substantially completely.

In a preferred embodiment, the heat treatment is performed by heating the substrate at a temperature that does not cause thermal fluidizing of the photoresist pattern on the substrate.

DETAILED DESCRIPTION OF THE INVENTION

The over-coating agent of the invention for forming fine features of patterns is used to be applied to cover a substrate, having photoresist patterns (mask patterns) thereon, including patterns typified by hole patterns or trench patterns, each of these patterns are defined by spacing between adjacent photoresist patterns (mask patterns). Upon heating, the applied film of over-coating agent shrinks to increase the width of each of the photoresist patterns, thereby narrowing or lessening adjacent hole patterns or trench patterns as defined by spacing between the photoresist patterns and, thereafter, the applied film is removed to form or define fine patterns.

The over-coating agent for forming fine patterns of the invention is characterized by comprising a water-soluble polymer wherein the total contents of both a monomeric component and a dimeric component are decreased to 10 mass % or less.

The water-soluble polymer may be any polymer that can dissolve in water at room temperature in removing the over-coating agent for forming fine patterns, and various types may be employed without particular limitation; preferred examples include polymers and/or copolymers having at least one selected from among acrylic monomers and vinyl monomers.

Exemplary acrylic monomers include (meth)acrylic acid, methyl(meth)acrylate, N,N-dimethyl(meth)acrylamide, N,N-dimethylaminopropyl(meth)acrylamide, N-methyl (meth)acrylamide, diacetone (meth) acrylamide, N,N-dimethylaminoethyl (meth)acrylate, N,N-diethylaminoethyl (meth)acrylate, and (meth) acryloylmorpholine, etc.

Exemplary vinyl monomers include N-vinylpyrrolidone, vinyl imidazolidinone, and vinyl acetate, etc.

Among these, it is preferred to employ acrylic monomers as essential components since they provide ease in pH adjustment. Furthermore, copolymers comprising acrylic monomers and vinyl monomers are most preferred since during heat treatment, the efficiency of shrinking the spacing between adjacent photoresist patterns (mask patterns) can be increased while maintaining the shape of the photoresist pattern.

When water-soluble polymers are used as copolymers, the proportions of the components are not limited to any particular values. However, if stability over time is important, the proportion of the acrylic monomers is preferably adjusted to be larger than vinyl monomers. Mostly preferred to employ copolymers including as constituent components (meth) acrylic acid and vinylpyrrolidone. In this case, copolymer including (meth)acrylic acid/vinylpyrrolidone=2/0.75-2/1.5 (polymerization ratio) are preferred in view of significantly improvement of the degree of thermal shrinkage of the over-coating agent to thereby reduce the line-to-line distance of the photoresist pattern.

The water-soluble polymer are additionally may include alkylene glycol polymers, cellulosic polymers, urea polymers, melamine polymers, epoxy polymers, amide polymers; and monomers that constitute these polymers. In this case, the total amount of monomeric components and dimeric components are reduced to 10 mass % or less in the water-soluble polymer including the above-mentioned polymers.

In the present invention, the total content of the monomeric component and the dimeric component in the water-soluble polymer is reduced to 10 mass % or less. As the water-soluble polymer, there is employed either an embodiment using a processed water-soluble polymer singly having a reduced total content of a monomeric component and a dimeric component, or other embodiment using a mixed polymer of a processed water-soluble polymer having a reduced total content of a monomeric component and a dimeric component and a non-processed water-soluble polymer having a non-reduced total content of a monomeric component and a dimeric component. When the mixed polymer is used, the total content of the monomeric component and the dimeric component in the mixed polymer is accordingly required to be 10 mass % or less, and therefore it is necessary to use the processed water-soluble polymer having a total content of the monomeric component and the dimeric component, which is reduced to less than 10 mass %, taking into consideration the amount of the non-processed water-soluble polymer incorporated.

For reducing the total content of the monomeric component and the dimeric component in the water-soluble polymer to 10 mass % or less, an ion-exchange treatment or the like may be preferably used, but not limited thereto.

In the invention, by reducing the total content of the monomeric component and the dimeric component in the water-soluble polymer to 10 mass % or less, the absolute value of the pitch dependency in the wafer plane of the over-coating agent for forming fine patterns can be reduced, and therefore the amount of the heat shrinkage (amount of shrinkage) of the over-coating agent can be controlled, irrespective whether the pitch is dense or isolate. Particularly, when a copolymer comprising two or more different monomeric components is used as the water-soluble polymer, the water-soluble polymer which has not been treated by ion-exchange (water-soluble polymer before ion-exchange treatment) is such that the ratio of the monomeric components (polymerization ratio) in the copolymer strongly affects the heat shrinkage of the over-coating agent, but the water-soluble polymer which has been treated by ion-exchange (water-soluble polymer after ion-exchange treatment) is such that the effect of the ratio of the monomeric components (polymerization ratio) on the heat shrinkage of the over-coating agent is small, or the water-soluble polymer before ion-exchange treatment and the water-soluble polymer after ion-exchange treatment exhibit an opposite effect of the ratio of the monomeric components (polymerization ratio) on the heat shrinkage. With respect to the water-soluble polymer such that the water-soluble polymer before ion-exchange treatment and the water-soluble polymer after ion-exchange treatment have an opposite tendency of the pitch dependency, by using a mixture of the water-soluble polymer before ion-exchange treatment and the water-soluble polymer after ion-exchange treatment, it is possible to cause the pitch dependency of both the isolate pattern and the dense pattern on a substrate having thereon patterns having different pitches to be close to zero.

From this point of view, in the invention, the embodiment using as the water-soluble polymer a mixed polymer of a processed water-soluble polymer having a reduced total content of a monomeric component and a dimeric component and a non-processed water-soluble polymer having a non-reduced total content of a monomeric component and a dimeric component is most preferably used. In this case, the total content of the monomeric component and the dimeric component in the mixed polymer is adjusted to 10 mass % or less.

When a mixture of the processed water-soluble polymer and the non-processed water-soluble polymer is used, it is preferred that the mixture contains the processed water-soluble polymer and non-processed water-soluble polymer in a [processed water-soluble polymer/non-processed water-soluble polymer] mass ratio of 4:6 to 1:9.

The over-coating agent for forming fine patters of the present invention may additionally contain water-soluble amines. For special purposes such as preventing the generation of impurities, pH adjustment, and excess of thermal shrinkage of the over-coating for forming fine patterns, water-soluble amines that have pKa (acid dissociation constant) values of 7.5-13 in aqueous solution at 25° C. are preferably used. Specific examples include the following: alkanolamines, such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine and triisopropanolamine; polyalkylenepolyamines, such as diethylenetriamine, triethylenetetramine, propylenediamine, N,N-diethylethylenediamine, 1,4-butanediamine, N-ethylethylenediamine, 1,2-propanediamine, 1,3-propanediamine and 1,6-hexanediamine; aliphatic amines, such as triethylamine, 2-ethyl-hexylamine, dioctylamine, tributylamine, tripropylamine, triallylamine, heptylamine and cyclohexylamine; aromatic amines, such as benzylamine and diphenylamine; and cyclic amines, such as piperazine, N-methylpiperazine and hydroxyethylpiperazine. Among these, preferred are those having boiling points (760 mmHg) of 140° C. or above, and monoethanolamine, triethanolamine, etc., are preferably exemplified. In view of excess of thermal-shrinkage, preferred one is triethylamine.

If the water-soluble amine is to be added, it is preferably incorporated in an amount of about 0.1-30 mass %, more preferably about 2-15 mass %, of the over-coating agent (in terms of solids content). By adopting the amount as described above ranges, it may effectively prevent the deterioration of the coating fluid over time and the deterioration in shape of the photoresist pattern.

For such purposes as reducing the dimensions of patterns and controlling the occurrence of defects, the over-coating agent for forming fine patterns may further optionally contain non-amine based, water-soluble organic solvents.

As such non-amine based, water-soluble organic solvents, any non-amine based organic solvents that can mix with water may be employed and they may be exemplified by the following: sulfoxides, such as dimethyl sulfoxide; sulfones, such as dimethylsulfone, diethylsulfone, bis(2-hydroxyethyl)sulfone and tetramethylenesulfone; amides, such as N,N-dimethylformamide, N-methylformamide, N,N-dimethylacetamide, N-methylacetamine and N,N-diethylacetamide; lactams, such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones, such as 1,3-dimethyl-2-imidazolidinone, 1,3-diethyl-2-imidazolidinone and 1,3-diisopropyl-2-imidazolidinone; and polyhydric alcohols and derivatives thereof, such as ethylene glycol, ethylene glycol monomethyl ether, ethylene glycol monoethyl ether, ethylene glycol monobuthyl ether, ethylene glycol monomethyl ether acetate, ethylene glycol monoethyl ether acetate, diethylene glycol, diethylene glycol monomethyl ether, diethylene glycol monoethyl ether, diethylene glycol monobuthyl ether, propylene glycol, propylene glycol monomethyl ether, glycerol, 1,2-butylene glycol, 1,3-butylene glycol and 2,3-butylene glycol. Among those mentioned above, polyhydric alcohols and their derivatives are preferred for the purposes of reducing the dimensions of patterns and controlling the occurrence of defects, and glycerol is particularly preferred. The non-amine based, water-soluble organic solvents may be used either singly or in combination.

If the non-amine based, water-soluble organic solvent is to be added, it is preferably incorporated in an amount of about 0.1-30 mass %, more preferably about 0.5-15 mass %, of the water-soluble polymer. By adopting the amount as described above ranges, a defect reducing effect is attained and it may effectively prevent the formation of a mixing layer at the interface with the photoresist pattern.

In addition, the over-coating agent may optionally contain a surfactant for attaining special effects such as coating uniformity and wafer's in-plane uniformity.

The surfactant is not specifically limited, but preferably employed that, when added to the water-soluble polymer, exhibits certain characteristics such as high solubility, non-formation of a suspension and miscibility with the polymer component. By using surfactants that satisfy these characteristics, the occurrence of defects can be effectively controlled that is considered to be pertinent to the occurrence of air-bubbles or foams (micro foams) upon coating the over-coating agent.

From the points above, surfactants in the invention are preferably employed at least the one selected among N-alkylpyrrolidones, quaternary ammonium salts and phosphate esters of polyoxyethylene.

N-alkylpyrrolidones as surfactant are preferably represented by the following general formula (I):

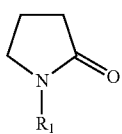

(I)

where $R_1$ is an alkyl group having at least 6 carbon atoms.

Specific examples of N-alkylpyrrolidones as surfactant include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone and N-octadecyl-2-pyrrolidone. Among these, N-octyl-2-pyrrolidone ("SURFADONE LP 100" of ISP Inc.) is preferably used.

Quaternary ammonium salts as surfactant are preferably represented by the following general formula (II):

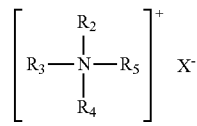

(II)

where $R_2$, $R_3$, $R_4$ and $R_5$ are each independently an alkyl group or a hydroxyalkyl group (provided that at least one of them is an alkyl or hydroxyalkyl group having not less than 6 carbon atoms); $X^-$ is a hydroxide ion or a halogenide ion.

Specific examples of quaternary ammonium salts as surfactant include dodecyltrimethylammonium hydroxide, tridecyltrimethylammonium hydroxide, tetradecyltrimethylammonium hydroxide, pentadecyltrimethylammonium hydroxide, hexadecyltrimethylammonium hydroxide, heptadecyltrimethylammonium hydroxide and octadecyltrimethylammonium hydroxide. Among these, hexadecyltrimethylammonium hydroxide is preferably used.

Phosphate esters of polyoxyethylene are preferably represented by the following general formula (III):

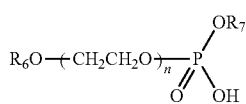

(III)

where $R_6$ is an alkyl or alkylaryl group having 1-10 carbon atoms; $R_7$ is a hydrogen atom or $(CH_2CH_2O)R_6$ (where $R_6$ is as defined above); n is an integer of 1-20.

To mention specific examples, phosphate esters of polyoxyethylene that can be used as surfactants are commercially available under trade names "PLYSURF A212E" and "PLYSURF A210G" from Dai-ichi Kogyo Seiyaku Co., Ltd.

If the surfactant is to be added, it is preferably incorporated in an amount of about 0.1-10 mass %, more preferably about 0.2-2 mass %, of the over-coating agent (in terms of solids content). By adopting the amount as described above ranges, it may effectively prevent the variations in the percent shrinkage of patterns, potentially depending on the wafer's in-plane uniformity which is caused by the deterioration of coating property, and also prevent the occurrence of defects that are considered to have cause-and-effect relations with microfoaming on the applied film that generates as the coating conditions are worsened.

The over-coating agent of the invention for forming fine patterns is preferably used as an aqueous solution at a concentration of 3-50 mass %, more preferably at 5-30 mass %. By controlling the concentration of the aqueous solution as described above, poor coverage of the substrate can be prevented. As already mentioned, the over-coating agent of the invention for forming fine patterns is usually employed as an aqueous solution using water as the solvent. A mixed solvent system comprising water and an alcoholic solvent may also be employed. Exemplary alcoholic solvents are monohydric alcohols including methyl alcohol, ethyl alcohol, propyl alcohol and isopropyl alcohol. These alcoholic solvents are mixed with water in amounts not exceeding about 30 mass %.

The over-coating agent of the invention for forming fine patterns has the advantage of improving resolution beyond the values inherent in photoresist materials and it can attain wafer's in-plane uniformity by eliminating the pattern variations in the plane of the substrate. Further, the over-coating agent of the invention can form patterns of good profile by eliminating the irregularities (line edge roughness; LER) in the shape of patterns due, for example, to the reflection of fluorescent light from the substrate. Yet another advantage of the over-coating agent is its ability to effectively increase the heat shrinkage amount of the over-coating agent (coating film), thereby achieving a remarkably improved effect of forming fine-line patterns. Especially, even when various patterns differing in the pattern dimension and the line-to-line distance exist on one substrate, the shrinkage amount of the over-coating agent can be controlled uniformly, irrespective whether the pitch is dense or isolate.

The method of forming fine-line patterns according to the second aspect of the invention comprises the steps of covering a substrate having photoresist patterns thereon with the above-described over-coating agent for forming fine patterns, then applying heat treatment to shrink the applied over-coating agent under the action of heat so that the spacing between adjacent photoresist patterns is reduced, and subsequently removing the applied film of the over-coating agent substantially completely.

The method of preparing the substrate having photoresist patterns thereon is not limited to any particular type and it can be prepared by conventional methods employed in the fabrication of semiconductor devices, liquid-crystal display devices, magnetic heads and microlens arrays. In an exemplary method, a photoresist composition of chemically amplifiable or other type is spin- or otherwise coated on a substrate such as a silicon wafer and dried to form a photoresist layer, which is illuminated with an activating radiation such as ultraviolet, deep-ultraviolet or excimer laser light through a desired mask pattern using a reduction-projection exposure system or subjected to electron beam photolithography, then heated and developed with a developer such as an alkaline aqueous solution, typically a 1-10 mass % tetramethylammonium hydroxide (TMAH) aqueous solution, thereby forming a photoresist pattern on the substrate.

The photoresist composition serving as a material from which photoresist patterns are formed is not limited in any particular way and any common photoresist compositions may be employed including those for exposure to i- or g-lines, those for exposure with an excimer laser (e.g. KrF, ArF or $F_2$) and those for exposure to EB (electron beams).

[a.] Over-Coating Agent Application Step

After thusly forming the photoresist pattern as a mask pattern, the over-coating agent for forming fine patterns is applied to cover entirely the substrate. After applying the over-coating agent, the substrate may optionally be pre-baked at a temperature of 80-100° C. for 30-90 seconds.

The over-coating agent may be applied by any methods commonly employed in the conventional heat flow process. Specifically, an aqueous solution of the over-coating agent for forming fine patterns is applied to the substrate by any known application methods including whirl coating with a spinner, etc.

[b.] Heat Treatment (Thermal Shrinkage) Step

In the next step, heat treatment is performed to cause thermal shrinkage of the film of the over-coating agent. Under the resulting force of thermal shrinkage of the film, the dimensions of the photoresist pattern in contact with the film will increase by an amount equivalent to the thermal shrinkage of the film and, as the result, the photoresist pattern widens and accordingly the spacing between the adjacent photoresist patterns lessens.

The heating temperature is not limited to any particular value as long as it is high enough to cause thermal shrinkage of the film of the over-coating agent and form or define a fine pattern. Heating is preferably done at a temperature that will not cause thermal fluidizing of the photoresist pattern. The temperature that will not cause thermal fluidizing of the photoresist pattern is such a temperature that when a substrate on which the photoresist pattern has been formed but no film of the over-coating agent has been formed is heated, the photoresist pattern will not experience any dimensional changes (for example, dimensional changes due to spontaneously fluidized deforming). Performing a heat treatment under such temperature conditions is very effective for various reasons, e.g. a fine-line pattern of good profile can be formed more efficiently and the duty ratio in the plane of a wafer, or the dependency on the spacing between photoresist patterns in the plane of a wafer, can be reduced. Considering the softening points of a variety of photoresist compositions employed in current photolithographic techniques, the preferred heat treatment is usually performed within a temperature range of about 80-160° C. for 30-90 seconds, provided that the temperature is not high enough to cause thermal fluidizing of the photoresist.

The thickness of the film of the over-coating agent for the formation of fine-line patterns is preferably just comparable to the height of the photoresist pattern or high enough to cover it.

[c.] Over-Coating Agent Removal Step

In the subsequent step, the remaining film of the over-coating agent on the substrate having photoresist patterns formed thereon is removed by washing with an aqueous solvent, preferably pure water, for 10-60 seconds. Prior to washing with water, rinsing may optionally be performed with an aqueous solution of alkali (e.g. tetramethylammonium hydroxide (TMAH) or choline). The over-coating agent of the present invention is easy to remove by washing with water and it can be completely removed from the substrate and the photoresist pattern.

As a result, each pattern on the substrate has a smaller feature size because each pattern is defined by the narrowed spacing between the adjacent widened photoresist patterns.

The fine-line pattern thus formed using the over-coating agent of the present invention has a pattern size smaller than the resolution limit attainable by the conventional methods. In addition, it has a good enough profile and physical properties that can fully satisfy the characteristics required of semiconductor devices.

Steps [a.]-[c.] may be repeated several times. By repeating steps [a.]-[c.] several times, the photoresist trace patterns (mask patterns) can be progressively widened.

The technical field of the present invention is not limited to the semiconductor industry and it can be employed in a wide range of applications including the fabrication of liquid-crystal display devices, the production of magnetic heads and even the manufacture of microlens arrays.

EXAMPLES

The following examples are provided for further illustrating the present invention but are in no way to be taken as limiting. Unless otherwise noted, all amounts of ingredients are expressed in mass %.

Example 1

7.0 g of a copolymer comprising acrylic acid/vinylpyrrolidone (AA/VP)[AA:VP=2:1.3 (polymerization ratio)], which had been obtained by subjecting an AA/VP copolymer to ion-exchange treatment (wherein the total content of the monomeric component and the dimeric component in the copolymer is about 9 mass %), 6 g of triethylamine, and 1 g of "PLYSURF A210G" (product of Dai-ichi Kogyo Seiyaku Co., Ltd.) as a polyoxyethylene phosphate surfactant were dissolved in pure water so that the amount of the resultant solution became 100 g, to prepare an over-coating agent for forming fine patterns.

A positive photoresist "TArF-7a-70" (product of Tokyo Oh-ka Kogyo Co., Ltd.) was applied to a substrate by spin coating and baked at 95° C. for 90 seconds to form a photoresist layer having a thickness of 0.25 μm.

The formed photoresist layer was subjected to exposure treatment using an exposure unit ("NSR-S306", product of Nikon Corp.), and subjected to heating treatment at 85° C. for 90 seconds, followed by development using a 2.38 mass % aqueous solution of TMAH (tetramethylammonium hydroxide), to form a contact hole pattern having a pitch of 1,000 nm (isolate pitch) and having a pattern diameter of 200 nm.

Separately, a contact hole pattern having a pitch of 220 nm (dense pitch) and having a diameter of 160 nm was formed on another substrate according to the same treatment procedure as mentioned above.

Then, the above-prepared over-coating agent was applied to each of the substrates respectively having thereon the above two types of contact hole patterns, and the resultant substrate was subjected to heating treatment at 148° C. for 60 seconds, to perform a size reduction treatment for the hole pattern. Subsequently, the over-coating agent was removed from the substrate using pure water at 23° C.

The size reductions of the patterns by the heating treatment were 14.88 nm and 14.28 nm, respectively, for the dense pitch and the isolate pitch.

Example 2

A mixed water-soluble polymer of 4.2 g of a copolymer comprising acrylic acid/vinylpyrrolidone (AA/VP)[AA: VP=2:1.3 (polymerization ratio)] and 2.8 g of a copolymer comprising acrylic acid/vinylpyrrolidone (AA/VP)[AA: VP=2:1.3 (polymerization ratio)], which had been obtained by subjecting an AA/VP copolymer to ion-exchange treatment (wherein the total content of the monomeric component and the dimeric component in the mixed copolymer is about 9 mass %), 6 g of triethylamine, and 1 g of "PLYSURF A210G" (product of Dai-ichi Kogyo Seiyaku Co., Ltd.) as a polyoxyethylene phosphate surfactant were dissolved in pure water so that the amount of the resultant solution became 100 g, to prepare an over-coating agent for forming fine patterns.

A positive photoresist "TArF-7a-70" (product of Tokyo Oh-ka Kogyo Co., Ltd.) was applied to a substrate by spin coating and baked at 95° C. for 90 seconds to form a photoresist layer having a thickness of 0.25 μm.

The formed photoresist layer was subjected to exposure treatment using an exposure unit ("NSR-S306", product of Nikon Corp.), and subjected to heating treatment at 85° C. for 90 seconds, followed by development using a 2.38 mass % aqueous solution of TMAH (tetramethylammonium hydroxide), to form a contact hole pattern having a pitch of 1,000 nm (isolate pitch) and having a pattern diameter of 200 nm.

Separately, a contact hole pattern having a pitch of 220 nm (dense pitch) and having a diameter of 160 nm was formed on another substrate according to the same treatment procedure as mentioned above.

Then, the above-prepared over-coating agent was applied to each of the substrates respectively having thereon the above two types of contact hole patterns, and the resultant substrate was subjected to heating treatment at 148° C. for 60 seconds, to perform a size reduction treatment for the hole pattern. Subsequently, the over-coating agent was removed from the substrate using pure water at 23° C.

The size reductions of the patterns by the heating treatment were 14.03 nm and 14.43 nm, respectively, for the dense pitch and the isolate pitch.

Comparative Example 1

A pattern size reduction treatment was performed by substantially the same method as in Example 2 except that the water-soluble polymer component of the over-coating agent for forming fine patterns comprised only the water-soluble polymer which had not been subjected to ion-exchange (wherein the total content of the monomeric component and the dimeric component in the water-soluble polymer is 14 mass %).

The size reduction of the pattern for the dense pitch was 25.12 nm, whereas that for the isolate pitch was 13.80 nm.

ADVANTAGE OF THE INVENTION

By the invention, in the technique utilizing a method of forming fine patterns, which comprises providing the over-coating agent (coating film) on a substrate having thereon a photoresist pattern and causing shrinkage of the resultant coating film to reduce the photoresist pattern spacing and then removing the coating film, even in reducing the pattern size on a substrate having thereon photoresist patterns having at least two different spacings, the reduction of the pattern size in the wafer plane (the reduction of the photoresist pattern spacing) can be controlled, irrespective whether the pattern pitch is dense or isolate.

What is claimed is:

1. An over-coating agent for forming patterns which is applied to cover a substrate having photoresist patterns thereon and allowed to shrink under heat so that the spacing between adjacent photoresist patterns is reduced, with the applied film of the over-coating agent being removed to form patterns, wherein
    (a) the over-coating agent comprises
        a water soluble polymer,
        a monomer of the same type as the monomer that constitutes the water soluble polymer and which is left unpolymerized, and
        a dimer formed from the monomer, and
    (b) the total content of the monomer and the dimer is 10% by mass or less relative to the total content of the water-soluble polymer, the monomer, and the dimer,
    wherein the water-soluble polymer is a mixed polymer of a water-soluble polymer processed by being subjected to ion exchange treatment and a water-soluble polymer not subjected to ion exchange treatment.

2. The over-coating agent for forming patterns according to claim 1, wherein the water-soluble polymer is a polymer and/or a copolymer, each of which comprises at least one member selected from an acrylic monomer and a vinyl monomer.

3. The over-coating agent for forming patterns according to claim 1, wherein the water-soluble polymer is a copolymer of (meth)acrylic acid and vinylpyrrolidone.

4. The over-coating agent for forming patterns according to claim 3, wherein the copolymer comprises (meth)acrylic acid and vinylpyrrolidone in (a)an [(meth)acrylic acid/vinylpyrrolidone] mass ratio of 2:0.75 to 2:1.5.

5. The over-coating agent for forming patterns according to claim 1, which further comprises a water-soluble amine.

6. The over-coating agent for forming patterns according to claim 1, which is an aqueous solution having a concentration of 3 to 50 mass%.

7. The over-coating agent for forming patterns according to claim 1, wherein a mixing ratio of the water-soluble polymer processed by being subjected to ion exchange treatment to the water-soluble polymer not subject to ion exchange treatment in the mixed polymer is in the range of 4:6 to 1:9 (mass ratio).

8. A method of forming patterns comprising the steps of covering a substrate having thereon photoresist patterns with the over-coating agent for forming patterns of claim 1, then applying heat treatment to shrink the applied over-coating agent under the action of heat so that the spacing between the adjacent photoresist patterns is reduced, and subsequently removing the applied film of the over-coating agent substantially completely.

9. The method of forming patterns according to claim 8, wherein the heat treatment is performed by heating the substrate at a temperature that does not cause thermal fluidizing of the photoresist pattern on the substrate.

10. The method of forming patterns according to claim 8, wherein the photoresist patterns on the substrate have at least two different spacings.

\* \* \* \* \*